US008078943B1

(12) United States Patent
Lee

(10) Patent No.: US 8,078,943 B1
(45) Date of Patent: Dec. 13, 2011

(54) ERROR CORRECTION CODE FOR CORRECTING SHIFT AND ADDITIVE ERRORS

(75) Inventor: Patrick J. Lee, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 873 days.

(21) Appl. No.: 12/126,839

(22) Filed: May 23, 2008

(51) Int. Cl.
*H03M 13/00* (2006.01)
(52) U.S. Cl. ...................................................... 714/781
(58) Field of Classification Search .................. 714/746, 714/752, 758, 781, 782, 787, 789
See application file for complete search history.

(56) References Cited

U.S. PATENT DOCUMENTS

| | | | |
|---|---|---|---|
| 5,220,568 A | 6/1993 | Howe et al. | |
| 5,257,270 A | 10/1993 | Hilden et al. | |
| 5,373,513 A | 12/1994 | Howe et al. | |
| 5,528,607 A | 6/1996 | Weng et al. | |
| 6,009,549 A | 12/1999 | Bliss et al. | |
| 6,108,152 A | 8/2000 | Du et al. | |
| 6,119,263 A * | 9/2000 | Mowbray et al. | 714/781 |
| 6,463,564 B1 | 10/2002 | Weng | |
| 6,583,943 B2 | 6/2003 | Malone, Sr. | |
| 6,640,319 B1 | 10/2003 | Weng | |
| 6,707,626 B2 | 3/2004 | Esumi | |
| 7,085,988 B1 | 8/2006 | Weng | |
| 7,099,095 B1 | 8/2006 | Subrahmanyam et al. | |
| 7,127,660 B2 | 10/2006 | Blaum | |
| 7,802,167 B1 * | 9/2010 | Gorshe | 714/762 |
| 7,810,015 B2 * | 10/2010 | Paumier et al. | 714/767 |
| 2005/0024759 A1 | 2/2005 | Sakai et al. | |
| 2006/0028749 A1 | 2/2006 | Tonami et al. | |

OTHER PUBLICATIONS

E. Tanaka and T. Kasai, "Synchronization and Substitution Error-Correcting Codes for the Levenshtein Metric", IEEE Transactions on Information Theory, vol. IT-22, No. 2, pp. 156-162, Mar. 1976.
L. Calabi and W.E. Hartnett, "A Family of Codes for the Correction of Substitution and Synchronization Errors", IEEE Transactions on Information Theory, vol. IT-15, No. 1, pp. 102-106, Jan. 1969.
Richard E. Blahut, "Theory and Practice of Error Control Codes", Chapters 2-5, pp. 16-129, Addison-Wesley Publishing Company, 1983.
V.I. Levenshtein, "Binary codes capable of correcting insertions, deletions and reversals", Soy. Phys. Dokl., vol. 10, No. 8, pp. 707-710, Feb. 1966.
Stiffler, J. "Comma-Free Error-Correcting Codes", IEEE Transactions on Information Theory, Jan. 1965, pp. 107-112.
Tavares, Stafford E., "Matrix Approach to Synchronization Recovery for Binary Cyclic Codes", IEEE Transactions on Information Theory, vol. IT-15, No. 1, Jan. 1969, pp. 93-101.
Tong, S.Y., "Correction of Synchronization Errors with Burst-Error-Correcting Cyclic Codes", IEEE Transactions on Information Theory, vol. IT-15, No. 1, Jan. 1969, pp. 106-109.

* cited by examiner

*Primary Examiner* — Shelly A Chase

(57) ABSTRACT

An error correction system is disclosed comprising an encoder operable to generate an encoded codeword of a polynomial code over a Galois field $GF(q)$ comprising q elements, wherein the encoded codeword comprises an input data sequence, at least one check symbol, and redundancy symbols. A decoder decodes a received codeword into the encoded codeword by correcting at least one error in the received codeword to generate a corrected codeword, evaluating at least one symbol of the corrected codeword relative to the check symbol in order to detect a shift error, and when the shift error is detected, shift the corrected codeword to correct the shift error.

25 Claims, 8 Drawing Sheets

UNSHIFTED CODEWORD $c(x) = x^m \cdot d(x) + (x^m d(x) \bmod G(X))$

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_M...r_2, r_1, r_0$ |

LEFT SHIFTED CODEWORD

| ADD ZEROS | b "1" BITS | INPUT DATA | REDUNDANCY |
|---|---|---|---|
| 0...0, 0, 0 | 1, 1, 1...1 | $d_N...d_2, d_1, d_0$ | $r_M...r_2, r_1, r_0$ |
| 0...0, 0, 1 | 1...1, 1, $d_N$ | $d_{N-1}...d_2, d_1, d_0, r_M$ | $r_{M-1}...r_2, r_1, r_0, 0$ |

FIG. 2B

RIGHT SHIFTED CODEWORD

| ADD ZEROS | b "1" BITS | INPUT DATA | REDUNDANCY |
|---|---|---|---|
| 0...0, 0, 0 | 1, 1, 1...1 | $d_N...d_2, d_1, d_0$ | $r_M...r_2, r_1, r_0$ |
| $r_0$, 0...0, 0, | 0, 1...1, 1 | 1, $d_N...d_2, d_1$ | $d_0, r_M...r_2, r_1$ |

FIG. 2C

UNSHIFTED SHORTENED CODEWORD

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_M...r_2, r_1, r_0$ |

FIG. 3A

"0" BIT LEFT SHIFTED CODEWORD

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_M...r_2, r_1, r_0$ |
| 0...0, 0, ⓪ | 1...1, 1, $d_N$ | $d_{N-1}...d_2, d_1, d_0, r_M$ | $r_{M-1}...r_2, r_1, r_0,$ ⓪ |

FIG. 3B

"1" BIT LEFT SHIFTED CODEWORD

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_M...r_2, r_1, r_0$ |
| 0...0, 0, ⓪ | 1...1, 1, $d_N$ | $d_{N-1}...d_2, d_1, d_0, r_M$ | $r_{M-1}...r_2, r_1, r_0,$ ① |

FIG. 3C

CORRECTED CODEWORD

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_M...r_2, r_1, r_0$ |
| 0...0, 0, ① | 1...1, 1, $d_N$ | $d_{N-1}...d_2, d_1, d_0, r_M$ | $r_{M-1}...r_2, r_1, r_0,$ ⓪ |

FIG. 3D

"0" BIT RIGHT SHIFTED CODEWORD

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_M...r_2, r_1, r_0$ |
| ⓪..0, 0, 0 | ⓪ 1...1, 1 | 1, $d_N...d_2, d_1$ | $d_0, r_M...r_2, r_1$ |

FIG. 3E

"1" BIT RIGHT SHIFTED CODEWORD

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_M...r_2, r_1, r_0$ |
| ⓪..0, 0, 0 | ① 1...1, 1 | 1, $d_N...d_2, d_1$ | $d_0, r_M...r_2, r_1$ |

FIG. 3F

CORRECTED CODEWORD

| ADD ZEROS | b "1" BITS | INPUT DATA | REDUNDANCY |
|---|---|---|---|
| 0...0, 0, 0 | 1...1, 1, 1 | $d_N...d_2, d_1, d_0$ | $r_N...r_2, r_1, r_0$ |
| ⓪ or ①..0, 0, 0 | ⓪ 1...1, 1 | 1, $d_N...d_2, d_1$ | $d_0, r_N...r_2, r_1$ |

APPENDED BITS  ADDED BIT  INPUT DATA  REDUNDANCY BITS

FIG. 4A $c(x) = $ [ 0 0 0 0 0 0 0 0 0 0 0 0 $\overset{x^{19}}{1}$ 0 0 $\overset{x^{15}}{1}$ 1 1 1 0 0 1 0 1 1 0 1 0 1 1 $\overset{x^0}{1}$ ]

$r(x) = $ [ 0 0 0 0 0 0 0 0 0 0 0 0 ⓪ 0 0 1 ⓪ 1 1 0 0 1 0 1 1 0 1 0 1 1 1 ⓪ ]

$u(x) = $ [ 0 0 0 0 0 0 0 0 0 0 0 0 ① 0 0 1 ① 1 1 0 0 1 0 1 1 0 1 0 1 1 1 ⓪ ]

$u_1(x) = c(x) = $ [ 0 0 0 0 0 0 0 0 0 0 0 0 1 0 0 1 1 1 1 0 0 1 0 1 1 0 1 0 1 1 1 ]

FIG. 4B $c(x) = $ [ 0 0 0 0 0 0 0 0 0 0 0 0 $\overset{x^{19}}{1}$ 0 0 $\overset{x^{15}}{1}$ 1 1 1 0 0 1 0 1 1 0 1 0 1 1 $\overset{x^0}{1}$ ]

$r(x) = $ [ 0 0 0 0 0 0 0 0 0 0 0 0 ⓪ 0 0 1 ⓪ 1 1 0 0 1 0 1 1 0 1 0 1 1 1 ① ]

$u(x) = $ [ 0 0 0 0 0 0 0 0 0 0 0 0 ① 0 0 1 ① 1 1 0 0 1 0 1 1 0 1 0 1 1 1 ⓪ ]

$u_1(x) = c(x) = $ [ 0 0 0 0 0 0 0 0 0 0 0 0 1 0 0 1 1 1 1 0 0 1 0 1 1 0 1 0 1 1 1 ]

FIG. 4C $$c(x) = [\overset{x^{30}}{0}\ 0\ 0\ 0\ 0\ 0\ 0\ 0\ 0\ 0\ 0\ 0\ \overset{x^{18}}{1}\ 0\ 0\ 1\ 1\ 1\ 1\ 0\ 0\ 1\ 0\ 1\ 1\ 0\ 1\ 0\ \overset{x^{2}}{1}\ 1\ 1\ ]$$

$$r(x) = [\ⓞ\ 0\ 0\ 0\ 0\ 0\ 0\ 0\ 0\ 0\ 0\ 0\ ⓪\ 0\ 0\ 1\ 1\ 1\ 1\ 0\ 0\ 1\ 0\ 1\ 1\ 0\ 1\ 0\ ①\ 1\ 1\ ]$$

$$u(x) = [\ ①\ 0\ 0\ 0\ 0\ 0\ 0\ 0\ 0\ 0\ 0\ 0\ ⓪\ 0\ 0\ 1\ 1\ 1\ 1\ 0\ 0\ 1\ 0\ 1\ 1\ 0\ 1\ 0\ 1\ 1\ 1\ ]$$

$$u_1(x) = c(x) = [\ 0\ 0\ 0\ 0\ 0\ 0\ 0\ 0\ 0\ 0\ 0\ 0\ 1\ 0\ 0\ 1\ 1\ 1\ 1\ 0\ 0\ 1\ 0\ 1\ 1\ 0\ 1\ 0\ 1\ 1\ 1\ ]$$

FIG. 4D $$c(x) = [\overset{x^{30}}{0}\ 0\ 0\ 0\ 0\ 0\ 0\ 0\ 0\ 0\ 0\ 0\ \overset{x^{18}}{1}\ 0\ 0\ 1\ 1\ 1\ 1\ 0\ 0\ 1\ 0\ 1\ 1\ 0\ 1\ 0\ \overset{x^{2}}{1}\ 1\ 1\ ]$$

ERROR CORRECTION CODE FOR CORRECTING SHIFT AND ADDITIVE ERRORS

BACKGROUND

Error correction codes (ECC) are employed in various industries, such as communication and storage systems, to detect and correct errors in a binary sequence transmitted through a communication channel. The ECC is typically implemented as a polynomial code over a Galois field GF(q), wherein if n is the code length (number of symbols per codeword) and a generator polynomial G(x) has degree m, there will be $q^{n-m}$ codewords (the number of polynomials of degree less than n that are divisible without remainder by G(x)). An example of a polynomial code is the Bose-Chaudhuri-Hochquenghem (BCH) code wherein the generator polynomial is chosen to have specific roots in an extension field in a way that achieves high Hamming distance. A polynomial code is "cyclic" if the generator polynomial G(x) divides $x^n - 1$. An important property of a cyclic code is that if any codeword of a code C is shifted left or right (multiplied by x or $x^{-1}$), the result is also a codeword in C.

Two basic types of errors that can manifest in a transmitted codeword are shift errors and additive errors. A shift error typically occurs when there is a synchronization error, causing the beginning of the codeword to be detected too soon (shifted right) or too late (shifted left). An additive error typically occurs when noise corrupts a symbol of a codeword, for example, changing a "1" bit to a "0" bit in a codeword of a binary code GF(2).

BRIEF DESCRIPTION OF THE DRAWINGS

FIG. 2A illustrates an unshifted codeword according to an embodiment of the present invention.

FIG. 2B illustrates a left shifted codeword according to an embodiment of the present invention.

FIG. 2C illustrates a right shifted codeword according to an embodiment of the present invention.

FIG. 3A shows an unshifted shortened codeword according to an embodiment of the present invention.

FIG. 3B illustrates a left shifted codeword wherein the element shifted into the codeword is a "0" bit according to an embodiment of the present invention.

FIG. 3C illustrates a left shifted codeword wherein the element shifted into the codeword is a "1" bit according to an embodiment of the present invention.

FIG. 3D shows a corrected codeword prior to correcting the left shift error according to an embodiment of the present invention.

FIG. 3E illustrates a right shifted codeword wherein the element shifted into the codeword is a "0" bit according to an embodiment of the present invention.

FIG. 3F illustrates a right shifted codeword wherein the element shifted into the codeword is a "1" bit according to an embodiment of the present invention.

FIG. 3G shows a corrected codeword prior to correcting the right shift error according to an embodiment of the present invention.

FIG. 4A illustrates an embodiment of the present invention wherein an encoded codeword comprises three input data bits, one check bit ("1" bit), fifteen redundancy bits, and twelve added "0 bits according to an embodiment of the present invention.

FIG. 4B illustrates a left shift error wherein the bit shifted into the received codeword is a "0" bit, and the corrected codeword according to an embodiment of the present invention.

FIG. 4C illustrates a left shift error wherein the bit shifted into the received codeword is a "1" bit, and the corrected codeword according to an embodiment of the present invention.

FIG. 4D illustrates a right shift error wherein the bit shifted into the received codeword is a "0" bit, and the corrected codeword according to an embodiment of the present invention.

FIG. 4E illustrates a right shift error wherein the bit shifted into the received codeword is a "1" bit, and the corrected codeword according to an embodiment of the present invention.

DETAILED DESCRIPTION OF EMBODIMENTS OF THE INVENTION

Figure 1:
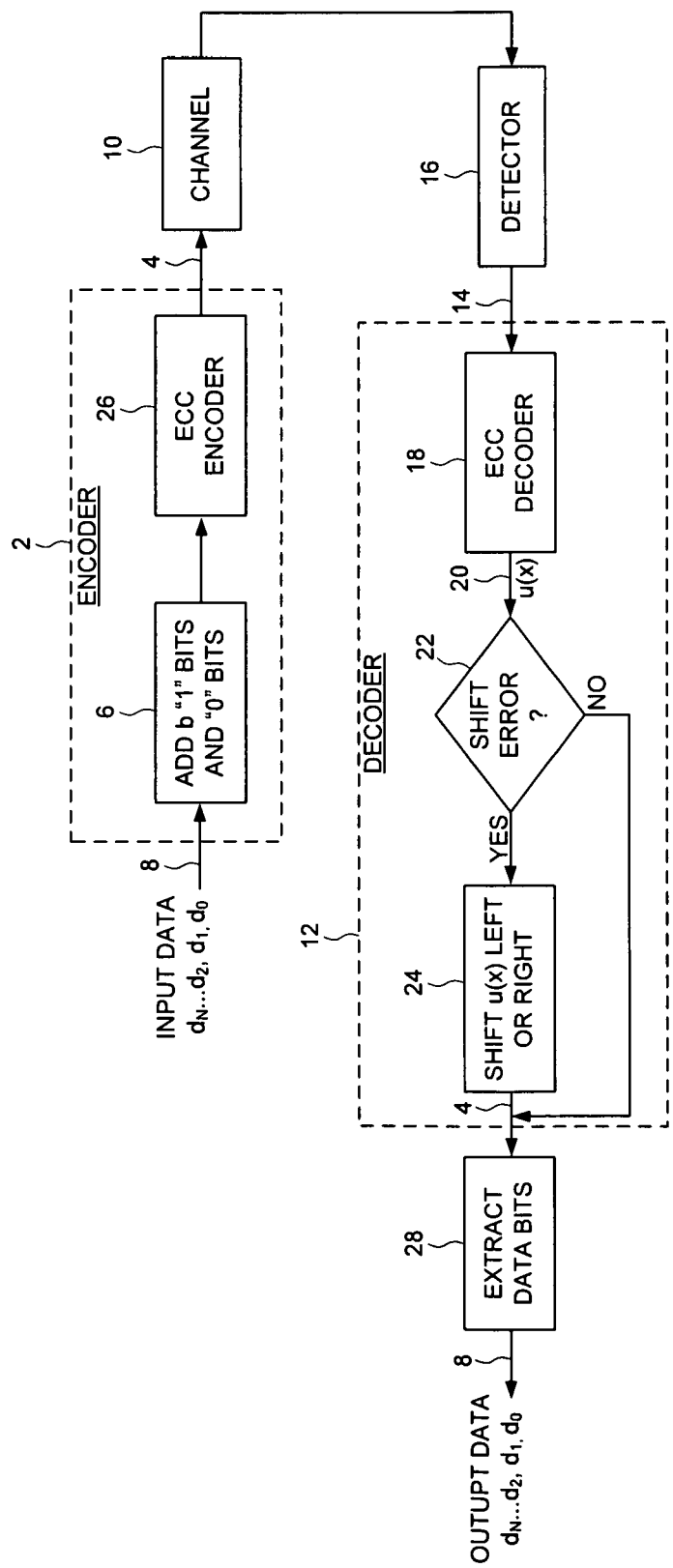
FIG. 1 shows an error correction system according to an embodiment of the present invention comprising an encoder for generating an encoded codeword having at least one check symbol for use in detecting a shift error in a received codeword.

FIG. 1 shows an error correction system according to an embodiment of the present invention comprising an encoder 2 operable to generate an encoded codeword 4 of a polynomial code over a Galois field GF(q) comprising q elements. The encoder 2 adds 6 at least one check symbol to an input data sequence $d_n \ldots d_2, d_1, d_0$ 8 to generate a data polynomial. The encoder 2 appends redundancy symbols to the data polynomial to form the encoded codeword 4. The encoded codeword 4 is transmitted through a channel 10, and a decoder 12 decodes a received codeword 14 received from the channel 10 (and detected by a detector 16) into the encoded codeword 4 by correcting 18 at least one error in the received codeword 14 to generate a corrected codeword 20, evaluating at least one symbol of the corrected codeword 20 relative to the check symbol in order to detect a shift error 22, and when the shift error is detected 22, shift 24 the corrected codeword 20 to correct the shift error.

In the embodiment of FIG. 1, the encoder 2 generates the redundancy symbols by dividing the data polynomial by a generator polynomial using a suitable ECC encoder 26 (e.g., a Reed-Solomon type encoder). Also in the embodiment of FIG. 1, the decoder 12 comprises a suitable ECC decoder 18 (e.g., a Reed-Solomon type decoder) for correcting at least one error in the received codeword. After correcting the additive error and the shift error, the data bits 8 are extracted 28 from the corrected codeword.

In one embodiment, the polynomial code comprises a suitable cyclic code wherein a n-symbol shift left or right of any one codeword will result in a different codeword (or the same codeword). In one embodiment, the polynomial code comprises N codewords referred to as $C_0$, wherein M of the N codewords $C_0$ are selected to form a subset of codewords referred to as C*. The C* codewords are selected such that a b-symbol shift (left or right) will not result in another C* codeword. In this manner, if the corrected $C_0$ codeword 20 output by the ECC decoder 18 is not a C* codeword, then the corrected $C_0$ codeword 20 is shifted left or right to generate the C* codeword.

Any suitable number of elements q in the Galois field GF(q) may be employed in the embodiments of the present invention (i.e., each symbol of a codeword may comprise any suitable number of bits). In the embodiments described below, a binary code is employed (q=2) wherein each symbol of a codeword comprises one bit ("0" or "1"). However, the aspects disclosed herein are easily extrapolated to any suitable number of elements; the binary code (q=2) described herein is merely exemplary. In one embodiment, when q is greater than 2, the elements of the polynomial code include a zero element (the element having all "0" bits), and the encoded codeword in C* does not include the zero element.

In one embodiment, the encoded codeword is generated by "adding" at least one appended symbol to the data polynomial prior to encoding the data polynomial into the encoded codeword. An example of this embodiment is shown in FIG. 2A wherein the appended symbols comprise a suitable number of "0" bits, and the check bits comprise b "1" bits. In one embodiment, the appended symbols are not physically added to the data polynomial; the ECC encoder 26 is simply clocked for the additional number of symbols while the input is set to "0" so that the redundancy symbols ($r_M$ ... , $r_2$, $r_1$, $r_0$) are generated over the entire data polynomial including the appended symbols.

FIG. 2B illustrates the effect of shifting a codeword left, wherein all of the symbols shift left and the left most symbol wraps around to become the right most symbol. FIG. 2C illustrates the effect of shifting a codeword right, wherein all of the symbols shift right and the right most symbol wraps around to become the left most symbol. In one embodiment, the codeword of FIG. 2A is a C* codeword, whereas the shifted codewords of FIGS. 2B and 2C are not C* codewords (but are still $C_0$ codewords).

FIG. 3A shows an embodiment of the present invention wherein the codeword with the appended symbols ("0" bits) represents an unshortened codeword, and the codeword without the appended symbols represents a shortened codeword. In one embodiment, only the shortened codeword is transmitted through the channel. When a shortened codeword is received from the channel, the ECC decoder "adds" the appended symbols to the shortened codeword to form the unshortened codeword. Similar to encoding, in one embodiment the appended symbols are not physically added; the ECC decoder 18 is simply clocked with the input set to "0". When a shift error occurs, it occurs in the shortened codeword received from the channel, but the unshortened codeword is corrected as if the shift occurred in the unshortened codeword.

FIG. 3B illustrates a left shift error wherein the symbol shifted into the shortened codeword is a "0" bit. Since the left most bit is a "0" bit, then the right most bit (circled) is not in error. However, since the appended symbols added to the shortened codeword to form the unshortened codeword are "0" bits, it means the right most appended "0" bit (circled) is in error since the left most check symbol is a "1" bit. FIG. 3C illustrates a left shift error wherein the symbol shifted into the shortened codeword is a "1" bit. In this case, since the left most bit is a "0" bit, then the right most bit (circled) is in error. In both cases, the ECC decoder 18 corrects the additive errors in the unshortened codeword (one additive error in FIG. 3B and two additive errors in FIG. 3C) to form a corrected $C_0$ codeword as shown in FIG. 3D. The left shift error is detected because an error is detected at the location of the appended symbols (the right most appended "0" bit is in error in both FIGS. 3B and 3C). Therefore, the encoded C* codeword of FIG. 3A is generated from the corrected $C_0$ codeword by shifting the corrected $C_0$ codeword right.

FIG. 3E illustrates a right shift error wherein the symbol shifted into the shortened codeword is a "0" bit (the left most check bit becomes the circled "0" bit). Since the right most bit is an unknown redundancy bit, then the left most bit (circled) may or may not be in error. However, since the appended symbols added to the shortened codeword to form the unshortened codeword are "0" bits, it means the left most check bit (circled) is not in error. FIG. 3F illustrates a right shift error wherein the symbol shifted into the shortened codeword is a "1" bit (circled) which is an additive error. In both cases, the ECC decoder 18 corrects the additive errors in the unshortened codeword (one additive error in FIG. 3E if $r_0$ is a "1" bit, and two additive errors in FIG. 3F if $r_0$ is a "1" bit) to form a corrected $C_0$ codeword as shown in FIG. 3G. The right shift error is detected because a "0" bit is detected in the corrected $C_0$ codeword at the location of the check symbols (the left most circled check symbol in FIG. 3G). Therefore, the encoded C* codeword of FIG. 3A is generated from the corrected $C_0$ codeword by shifting the corrected $C_0$ codeword left.

In the example illustrated in FIGS. 3A-3G, if there are no shift errors in the unshortened codeword, then the ECC decoder 18 corrects the additive errors in the received codeword to generate the encoded C* codeword. Therefore, in one embodiment the polynomial code is capable of detecting and correcting at least t−2b additive errors in a received codeword, where b is the number of shifts. In the example illustrated in FIGS. 3A-3G there is a single symbol shift (b=1); however, the aspects of the invention can be extended to correct b symbol shifts. In some embodiments, b is less than or equal to t/2.

FIG. 4A illustrates an example embodiment of the present invention wherein the polynomial code is a BCH triple error correcting (31,16) code with roots in $GF(2^5)$. The generator polynomial G(x) is as shown in FIG. 4A such that an encoded codeword comprises three input data bits, one check bit ("1" bit), fifteen redundancy bits, and twelve added "0 bits (resulting in a shortened (19,4) code). Since there are three input data bits, this embodiment requires eight C* codewords as shown in FIG. 4A.

FIG. 4B illustrates a left shift error in the second C* codeword wherein the symbol shifted into the right side of the codeword is a "0" bit. The received codeword r(x) also comprises an additive error at location $x^{15}$, which means the codeword comprises two additive errors including an additive error at location $x^{19}$ due to the shift error (the symbol at location $x^0$ is not in error since the symbol shifted into the right side of the codeword is a "0" bit). After correcting the received codeword r(x), the left shift error is detected since there was an error at location $x^{19}$. The encoded C* codeword c(x) is therefore generated by shifting the corrected $C_0$ codeword u(x) right as shown in FIG. 4B.

FIG. 4C illustrates a left shift error in the second C* codeword wherein the symbol shifted into the right side of the codeword is a "1" bit. The received codeword r(x) also comprises an additive error at location $x^{15}$, which means the codeword comprises three additive errors including an additive error at location $x^{19}$ due to the shift error, and the symbol at location $x^0$ since the symbol shifted into the right side of the codeword is a "1" bit. After correcting the received codeword r(x), the left shift error is detected since there was an error at location $x^{19}$. The encoded C* codeword c(x) is therefore generated by shifting the corrected $C_0$ codeword u(x) right as shown in FIG. 4C.

FIG. 4D illustrates a right shift error in the second C* codeword wherein the symbol shifted into the left side of the shortened codeword is a "0" bit. The received codeword r(x) also comprises an additive error at location $x^2$, which means the codeword comprises two additive errors including an additive error at location $x^{30}$ due to the shift error (the symbol at location $x^{18}$ is not in error since the symbol shifted into the left side of the codeword is a "0" bit). After correcting the received codeword r(x), the right shift error is detected since there is a "0" bit at location $x^{18}$ in the corrected codeword u(x). That is, the right shift error is detected when the location of the check symbol comprises a target element, where in this example the target element is a "0" bit. The encoded C* codeword c(x) is therefore generated by shifting the corrected $C_0$ codeword u(x) left as shown in FIG. 4D.

FIG. 4E illustrates a right shift error in the second C* codeword wherein the symbol shifted into the left side of the codeword is a "1" bit. The received codeword r(x) also comprises an additive error at location $x^2$, which means the codeword comprises three additive errors including an additive error at location $x^{30}$ due to the shift error, and the symbol at location $x^{18}$ since the symbol shifted into the left side of the codeword is a "1" bit. After correcting the received codeword r(x), the right shift error is detected since there is a "0" bit at location $x^{18}$ in the corrected codeword u(x). The encoded C* codeword c(x) is therefore generated by shifting the corrected $C_0$ codeword u(x) left as shown in FIG. 4E.

Figure 5:
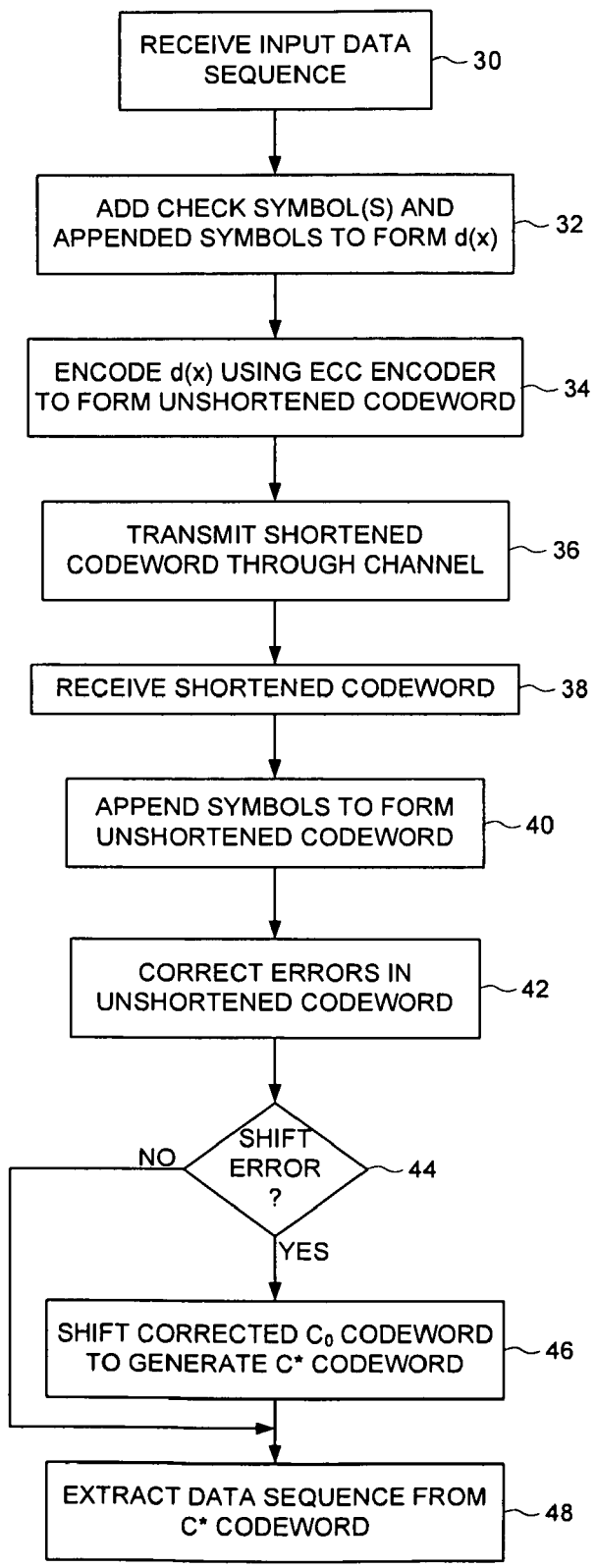
FIG. 5 is a flow diagram according to an embodiment of the present invention wherein a received codeword is corrected, the corrected codeword evaluated to detect a shift error, and shifting the corrected codeword to generate the originally encoded codeword.

FIG. 5 is a flow diagram according to an embodiment of the present invention wherein after receiving an input data sequence (step 30) at least one check symbol and a plurality of appended symbols are added to the data sequence to form a dataword d(x) (step 32). The dataword d(x) is encoded using an ECC encoder to form an unshortened codeword in C* including redundancy symbols (step 34). The shortened codeword is then transmitted through a channel (step 36) and a shortened codeword is received from the channel (step 38). The appended symbols (e.g., "0" bits) are added to the shortened codeword to form an unshortened codeword (step 40). Errors in the unshortened codeword are corrected (step 42), and the corrected codeword is evaluated to detect a shift error (step 44). If a shift error is detected, the corrected $C_0$ codeword is shifted (left or right) to generate the encoded C* codeword originally transmitted through the channel (step 46). The data sequence is then extracted from the C* codeword (step 48).

Figure 6:
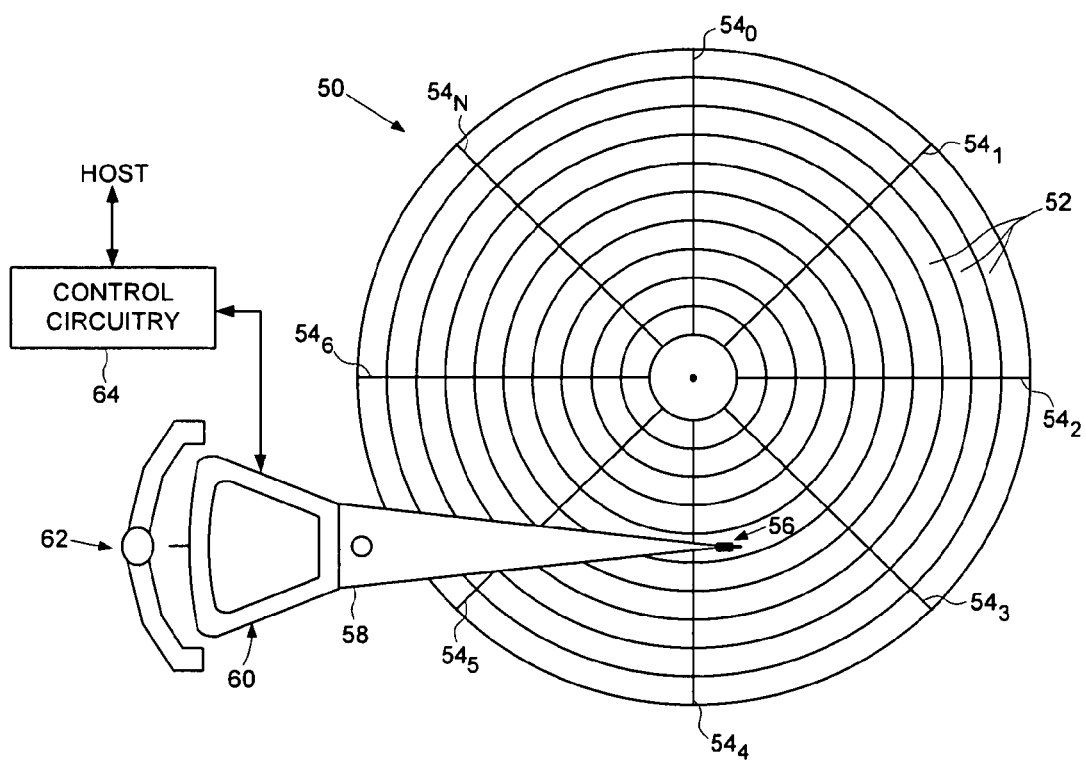
FIG. 6 shows a disk drive according to an embodiment of the present invention wherein control circuitry comprises the error correction system shown in FIG. 1.

Any suitable channel 10 (FIG. 1) may be employed in the embodiments of the present invention, such as a communication channel or a storage channel. FIG. 6 shows an embodiment of the present invention wherein the channel 10 comprises a disk drive. The disk drive comprises a disk 50 having a plurality of data tracks 52 defined by embedded servo sectors $54_0$-$54_N$. A head 56 is connected to a distal end of an actuator arm 58 which is rotated by a voice coil motor (VCM) about a pivot in order to actuate the head 56 radially over the disk 50 in order to access the data tracks 52. The VCM comprises a voice coil 60 which interacts with permanent magnets (not shown) to generate the rotational torque. A crash stop 62 limits the stroke of the actuator arm 58 to protect the head 56. The disk drive further comprises control circuitry 64 including the encoder/decoder of FIG. 1 for implementing the embodiments of the present invention.

Any suitable control circuitry may be employed to implement the flow diagrams in the embodiments of the present invention, such as any suitable integrated circuit or circuits. For example, the control circuitry may be implemented within a read channel integrated circuit, or in a component separate from the read channel, such as a disk controller, or certain steps described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into an SOC.

In one embodiment, the control circuitry comprises a microprocessor executing instructions, the instructions being operable to cause the microprocessor to perform the steps of the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

What is claimed is:

1. An error correction system comprising:
   an encoder operable to generate an encoded codeword of a polynomial code over a Galois field GF(q) comprising q elements, the encoded codeword comprising a plurality of symbols wherein each symbol comprises one of the q elements, the encoder operable to:
      add at least one check symbol to an input data sequence $d_n \ldots d_2, d_1, d_0$ to generate a data polynomial; and
      append redundancy symbols to the data polynomial to form the encoded codeword, wherein the encoded codeword is transmitted through a channel; and
   a decoder for decoding a received codeword received from the channel into the encoded codeword, the decoder operable to:
      correct at least one error in the received codeword to generate a corrected codeword;
      evaluate at least one symbol of the corrected codeword relative to the check symbol in order to detect a shift error; and
      when the shift error is detected, shift the corrected codeword to correct the shift error.

2. The error correction system as recited in claim 1, wherein the encoder is operable to generate the redundancy symbols by dividing the data polynomial by a generator polynomial.

3. The error correction system as recited in claim 1, wherein the encoded codeword comprises:
   an unshortened codeword comprising the data polynomial, at least one appended symbol, and the redundancy symbols; and
   a shortened codeword comprising the data polynomial and the plurality of redundancy symbols.

4. The error correction system as recited in claim 3, wherein the shortened codeword is transmitted through the channel without the appended symbols.

5. The error correction system as recited in claim 3, wherein:
   q=2 such that the elements of GF(2) comprises "0" and "1"; and
   the appended symbol comprises "0".

6. The error correction system as recited in claim 3, wherein the shift error is detected by evaluating at least one of the appended symbol locations in the received codeword.

7. The error correction system as recited in claim 6, wherein the shift error is detected when an error is detected at the location of the appended symbol.

8. The error correction system as recited in claim 1, wherein the shift error is detected by evaluating the location of the check symbol in the received codeword.

9. The error correction system as recited in claim 8, wherein the shift error is detected when the location of the check symbol comprises a target element.

10. The error correction system as recited in claim 1, wherein:
  q=2 such that the elements of GF(2) comprise "0" and "1"; and
  the check symbol added to the input data sequence comprises "1".

11. The error correction system as recited in claim 10, wherein the shift error is detected when the symbol in the received codeword at the location of the check symbol is "0".

12. The error correction system as recited in claim 1, wherein the shift error comprises a shift of b symbols in the encoded codeword where b is equal to or greater than one.

13. The error correction system as recited in claim 12, wherein the decoder is further operable to correct at least one additive error in the received codeword in addition to the shift error.

14. The error correction system as recited in claim 13, wherein the decoder is further operable to correct at least $t-2b$ additive errors in the received codeword.

15. The error correction system as recited in claim 13, wherein the channel comprises a disk of a disk drive.

16. A method of transmitting data through a channel, the method comprising:
  generating an encoded codeword of a polynomial code over a Galois field GF(q) comprising q elements, the encoded codeword comprising a plurality of symbols wherein each symbol comprises one of the q elements, the generating comprising:
    adding at least one check symbol to an input data sequence $d_n \ldots d_2, d_1, d_0$ to generate a data polynomial; and
    appending redundancy symbols to the data polynomial to form the encoded codeword, wherein the encoded codeword is transmitted through the channel; and
  decoding a received codeword received from the channel into the encoded codeword, the decoding comprising:
    correcting at least one error in the received codeword to generate a corrected codeword;
    evaluating at least one symbol of the corrected codeword relative to the check symbol in order to detect a shift error; and
    when the shift error is detected, shifting the corrected codeword to correct the shift error.

17. The method as recited in claim 16, wherein the redundancy symbols are generated by dividing the data polynomial by a generator polynomial.

18. The method as recited in claim 16, wherein the encoded codeword comprises:
  an unshortened codeword comprising the data polynomial, at least one appended symbol, and the redundancy symbols; and
  a shortened codeword comprising the data polynomial and the plurality of redundancy symbols.

19. The method as recited in claim 18, wherein the shortened codeword is transmitted through the channel without the appended symbols.

20. The method as recited in claim 18, wherein:
  q=2 such that the elements of GF(2) comprises "0" and "1"; and
  the appended symbol comprises "0".

21. The method as recited in claim 18, wherein the shift error is detected by evaluating at least one of the appended symbol locations in the received codeword.

22. The method as recited in claim 21, wherein the shift error is detected when an error is detected at the location of the appended symbol.

23. The method as recited in claim 16, wherein the shift error is detected by evaluating the location of the check symbol in the received codeword.

24. The method as recited in claim 23, wherein the shift error is detected when the location of the check symbol comprises a target element.

25. A disk drive comprising:
  a disk;
  a head actuated over the disk;
  an encoder operable to generate an encoded codeword of a polynomial code over a Galois field GF(q) comprising q elements, the encoded codeword comprising a plurality of symbols wherein each symbol comprises one of the q elements, the encoder operable to:
    add at least one check symbol to an input data sequence $d_n \ldots d_2, d_1, d_0$ to generate a data polynomial; and
    append redundancy symbols to the data polynomial to form the encoded codeword, wherein the encoded codeword is written to the disk; and
  a decoder for decoding a received codeword read from the disk into the encoded codeword, the decoder operable to:
    correct at least one error in the received codeword to generate a corrected codeword;
    evaluate at least one symbol of the corrected codeword relative to the check symbol in order to detect a shift error; and
    when the shift error is detected, shift the corrected codeword to correct the shift error.

* * * * *